(12) United States Patent
Augustin et al.

(10) Patent No.: US 11,374,323 B2
(45) Date of Patent: Jun. 28, 2022

(54) PATCH ANTENNAS STITCHED TO SYSTEMS IN PACKAGES AND METHODS OF ASSEMBLING SAME

(71) Applicant: Intel Corporation, Santa Clara, CA (US)

(72) Inventors: Andreas Augustin, Munich (DE); Sonja Koller, Regensburg (DE); Bernd Waidhas, Pettendorf (DE); Georg Seidemann, Landshut (DE); Andreas Wolter, Regensburg (DE); Stephan Stoeckl, Schwandorf (DE); Thomas Wagner, Regelsbach (DE); Josef Hagn, Neubiberg (DE)

(73) Assignee: Intel Corporation, Santa Clara, CA (US)

( * ) Notice: Subject to any disclaimer, the term of this patent is extended or adjusted under 35 U.S.C. 154(b) by 218 days.

(21) Appl. No.: 16/473,566

(22) PCT Filed: Mar. 31, 2017

(86) PCT No.: PCT/US2017/025512
§ 371 (c)(1),
(2) Date: Jun. 25, 2019

(87) PCT Pub. No.: WO2018/182718
PCT Pub. Date: Oct. 4, 2018

(65) Prior Publication Data
US 2020/0144723 A1     May 7, 2020

(51) Int. Cl.
*H01Q 9/04*     (2006.01)
*H01L 23/00*     (2006.01)
(Continued)

(52) U.S. Cl.
CPC .......... *H01Q 9/0414* (2013.01); *H01L 24/85* (2013.01); *H01Q 1/2283* (2013.01); *H01Q 21/065* (2013.01); *H01L 2924/15311* (2013.01)

(58) Field of Classification Search
CPC ............ H01L 24/85; H01L 2224/1134; H01Q 1/2283; H01Q 9/0414; H01Q 11/14
See application file for complete search history.

(56) References Cited

U.S. PATENT DOCUMENTS 9,331,030 B1 * 5/2016 Tsai ................... H01L 21/76877
2002/0089399 A1 * 7/2002 Massey ................ H01R 9/0515
333/254

(Continued)

FOREIGN PATENT DOCUMENTS

KR        101690112 B1    12/2016
WO    WO-2018182718 A1    10/2018

OTHER PUBLICATIONS

"International Application Serial No. PCT US2017 025512, International Preliminary Report on Patentability dated Oct. 10, 2019", 6 pgs.

(Continued)

*Primary Examiner* — Ricardo I Magallanes
(74) *Attorney, Agent, or Firm* — Schwegman Lundberg & Woessner, P.A.

(57) ABSTRACT

A patch antenna array is fabricated with a package-on-package setup that contains a transceiver. The patch antenna array has a footprint that intersects the transceiver footprint. The package-on-package setup includes through-mold vias that couple to a redistribution layer disposed between the patch antennas and the package-on-package setup.

15 Claims, 10 Drawing Sheets

(51) Int. Cl.
*H01Q 1/22* (2006.01)
*H01Q 21/06* (2006.01)

(56) References Cited

U.S. PATENT DOCUMENTS

| | | | |
|---|---|---|---|
| 2013/0292808 A1* | 11/2013 | Yen | H01L 23/5227 |
| | | | 257/660 |
| 2014/0145883 A1* | 5/2014 | Baks | H01Q 1/2283 |
| | | | 343/700 MS |
| 2014/0152512 A1 | 6/2014 | Yen et al. | |
| 2014/0184460 A1 | 7/2014 | Yen | |
| 2016/0240495 A1 | 8/2016 | Lachner et al. | |

OTHER PUBLICATIONS

"International Application Serial No. PCT/US2017/025512, International Search Report dated Dec. 27, 2017", 3 pgs.
"International Application Serial No. PCT/US2017/025512, Written Opinion dated Dec. 27, 2017", 4 pgs.

\* cited by examiner

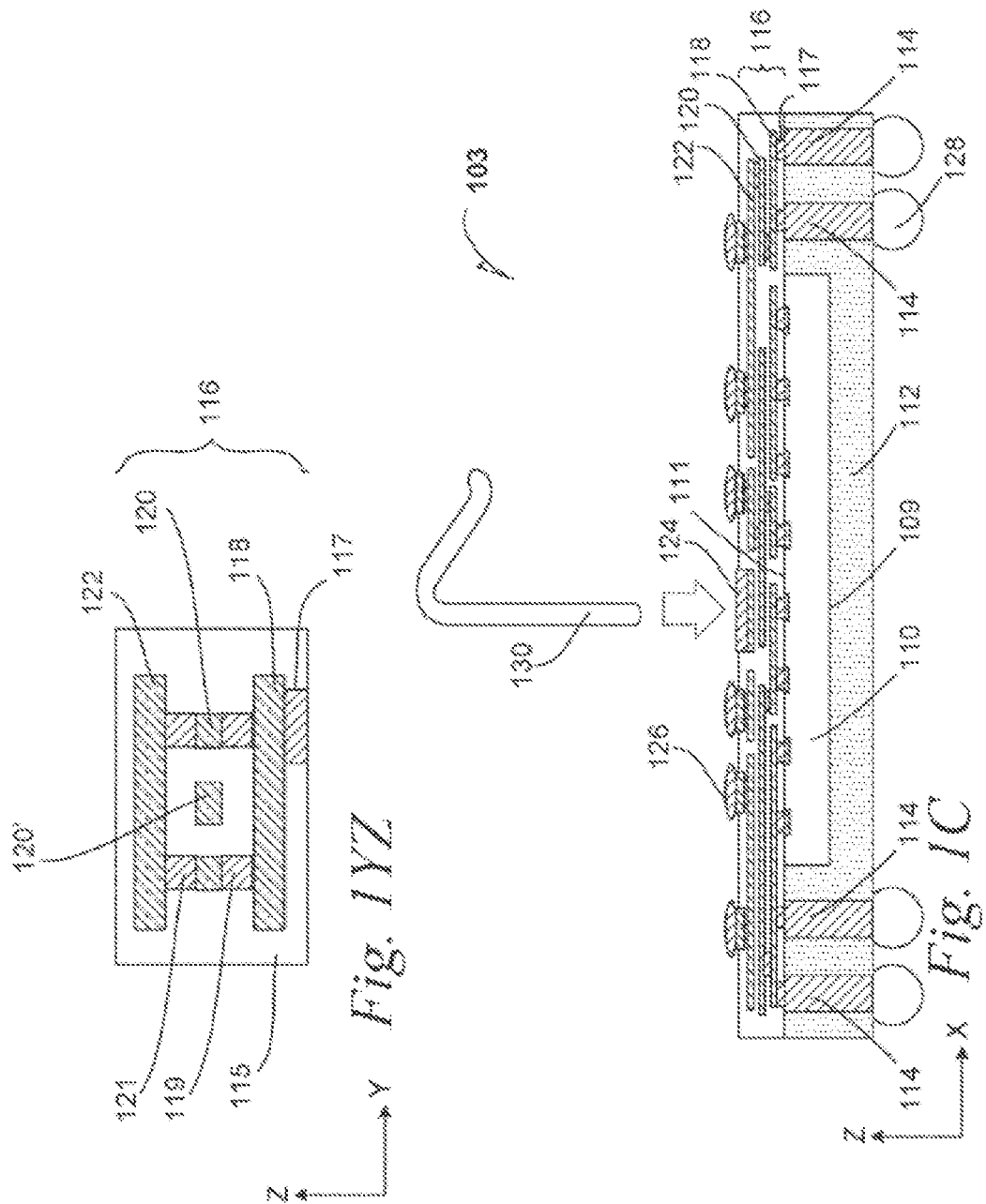

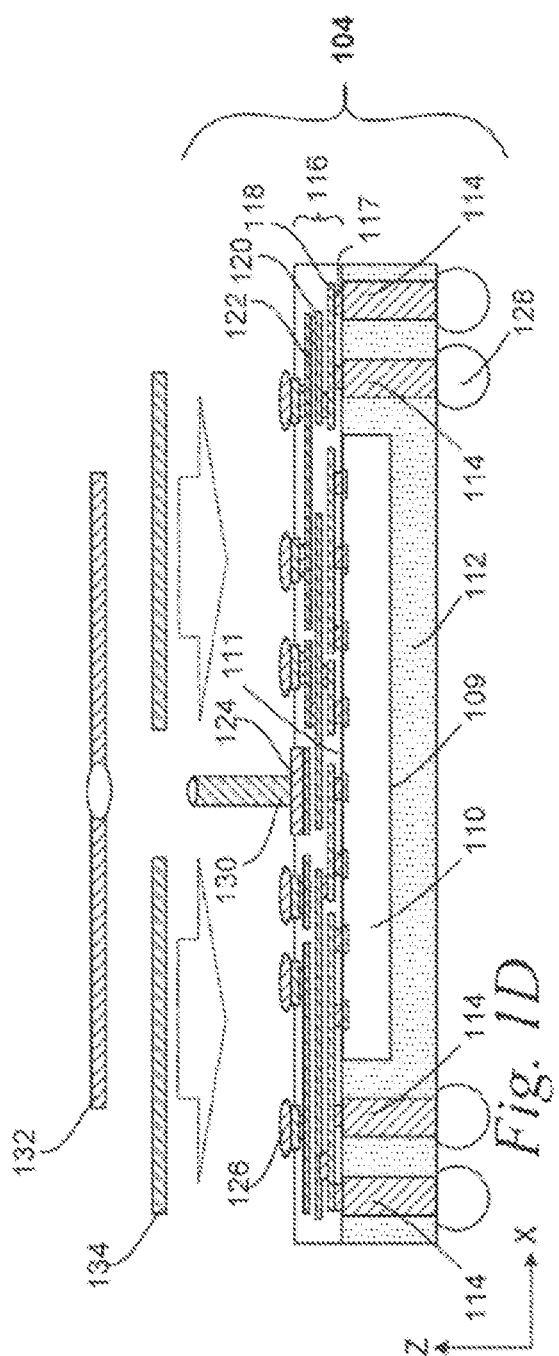
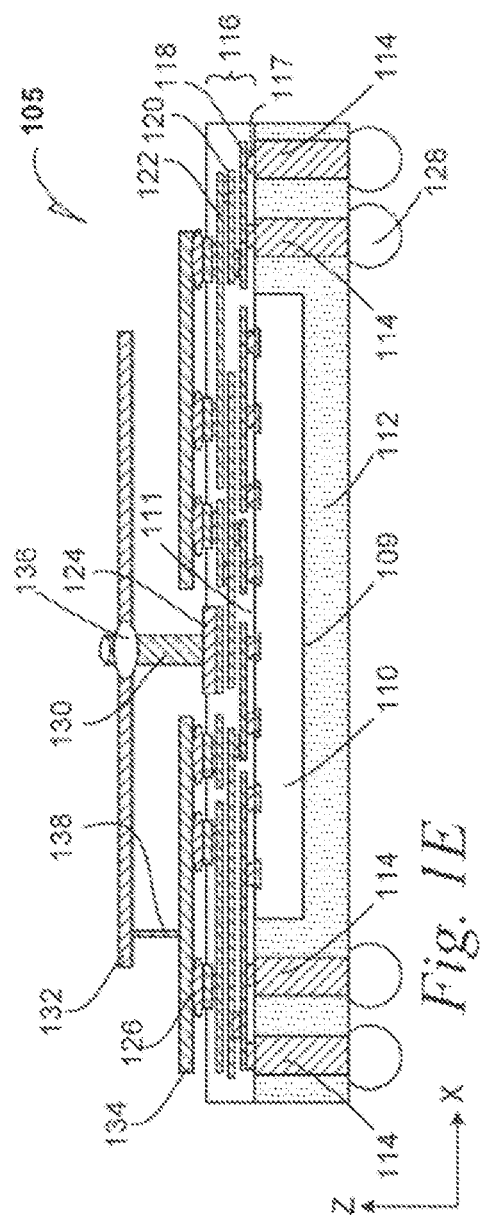
Fig. 1D
Fig. 1E

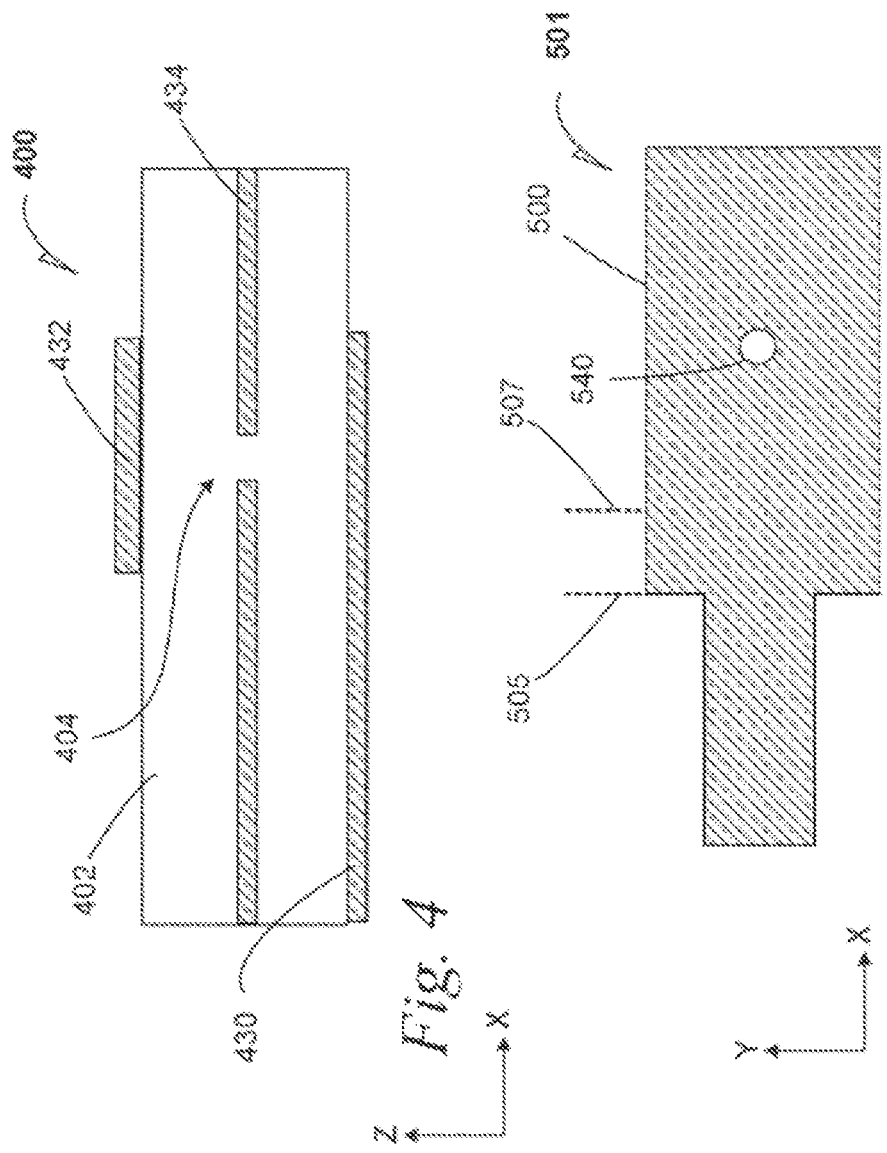

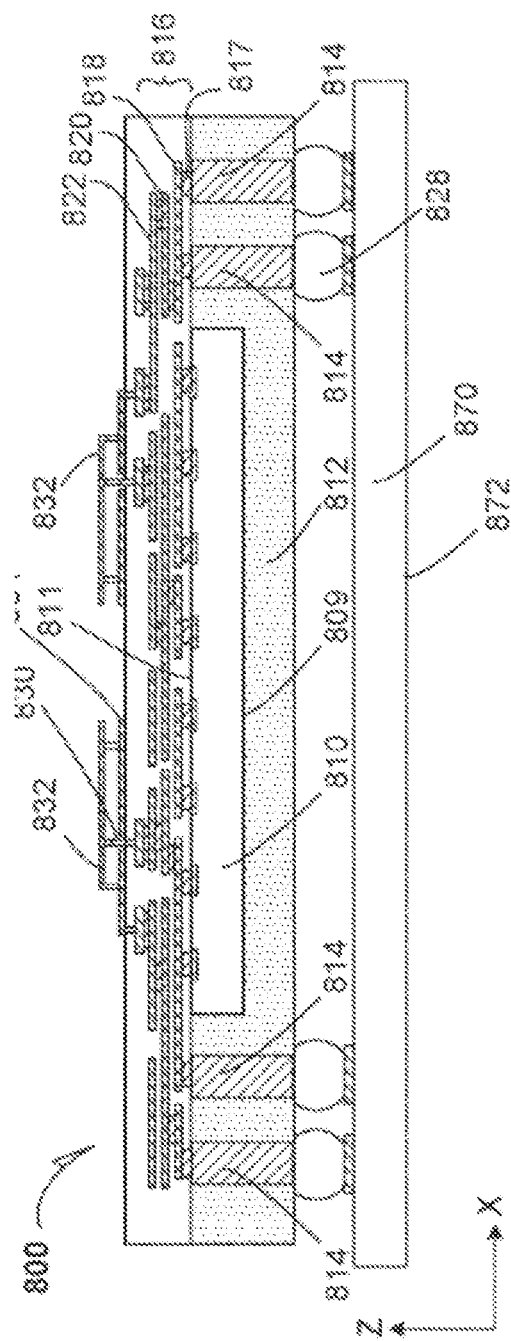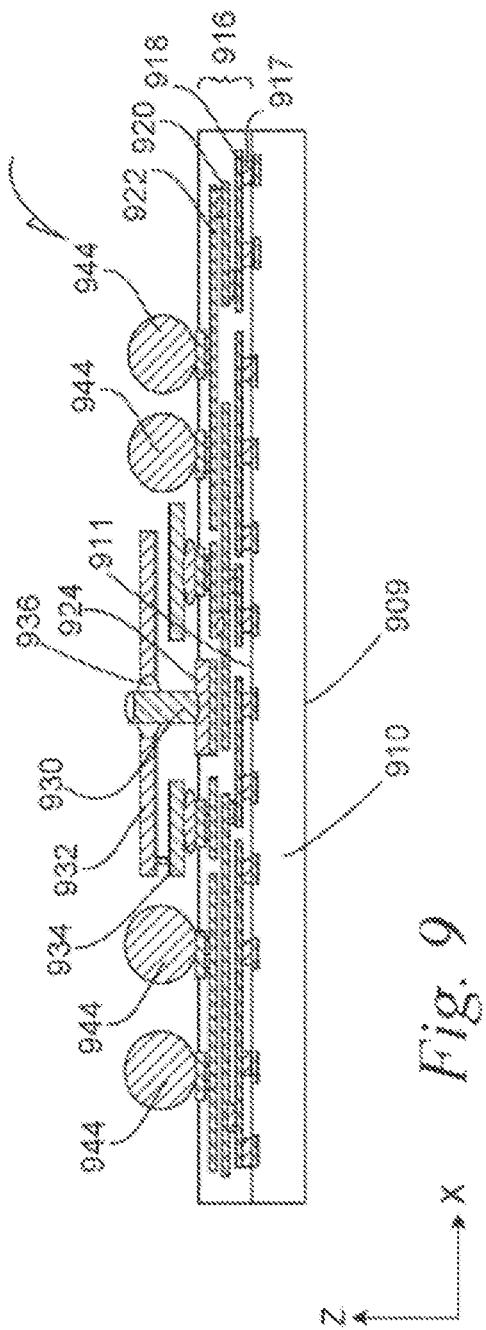

US 11,374,323 B2

PATCH ANTENNAS STITCHED TO SYSTEMS IN PACKAGES AND METHODS OF ASSEMBLING SAME

CLAIM OF PRIORITY

This application is a U.S. National Stage Application under 35 U.S.C. 371 from International Application No. PCT/US2017/025512, filed Mar. 31, 2017, published as WO 2018/182718, which is incorporated herein by reference in its entirety.

FIELD

This disclosure relates to patch antenna technologies assembled in system-in-package semiconductive apparatus.

BACKGROUND

Semiconductive device miniaturization creates challenges for locating useful passive devices during integration. Emitter technology miniaturization is challenged to keep pace with semiconductive-device miniaturization.

BRIEF DESCRIPTION OF THE DRAWINGS

Disclosed embodiments are illustrated by way of example, and not by way of limitation, in the figures of the accompanying drawings where like reference numerals may refer to similar elements, in which:

FIG. 1YZ is a cross-section detail of a portion of the package-on-package setup depicted in FIG. 1B according to an embodiment;

FIG. 1C is a cross-section elevation of the package-on-package setup depicted in FIG. 1B after further processing according to an embodiment;

FIG. 1D is a cross-section elevation of the package-on-package setup depicted in FIG. 1C after further processing according to an embodiment;

FIG. 1E is a cross-section elevation of the package-on-package setup depicted in FIG. 1D after further processing according to an embodiment;

FIG. 4 is a cross-section elevation of portions of a patch antenna and ground structure that uses an aperture-coupled patch antenna according to an embodiment;

FIG. 5A is a top plan of a portion of a patch antenna according to an embodiment;

FIG. 8 is a cross-section elevation of a package-on-package setup with folded patch antennas according to an embodiment;

FIG. 9 is a cross-section elevation of a portion of a patch antenna and transceiver module according to an embodiment;

DETAILED DESCRIPTION

Patch antenna technology is useful for radio-frequency connectivity in mobile devices. Packaging of a radio-frequency transceiver with patch antenna elements, poses opportunities shorten the distance between the RF transceiver and the antenna. Wirebonding the patch antenna to a redistribution layer allows the distance to be shortened. The patch antenna may also be located to at least intersect the transceiver footprint in a ball-grid array package-on-package that includes the patch antenna array.

The patch antenna may be configured in a planar flat inverted-F (PIFA) antenna shape. Other patch antenna configurations may be used with the embodiments. In any event whether a PIFA shape or otherwise, the patch antenna is excited by a probe feed in the form of a bond wire that is in contact with the patch antenna.

Figure 1A:
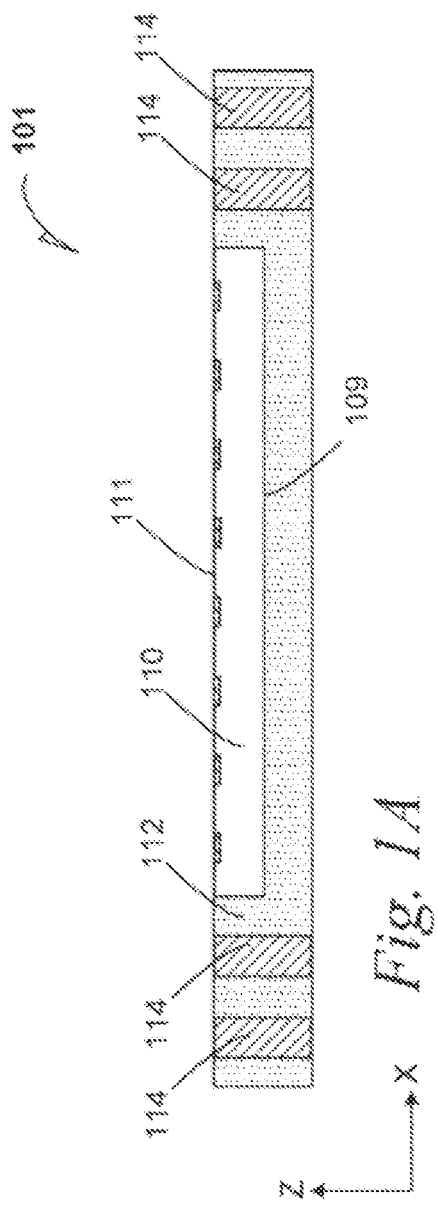
FIG. 1A is a cross-section elevation of a transceiver in a package-on-package apparatus during assembly according to an embodiment.

FIG. 1A is a cross-section elevation 101 of a transceiver 110 in a package-on-package (PoP) apparatus during assembly according to an embodiment. The radio frequency (RF) transceiver 110 (hereinafter, transceiver) is partially embedded in a molding mass 112 in a PoP setup 101. The transceiver 110 includes an active surface 111 and a backside surface 109.

A plurality of through-mold vias (TMVs) 114 communicate through the molding mass 112. The active surface 111 of the transceiver 110 emerges from the molding mass 112 at the same Z-direction location as TMVs 114, within the assembly parameters of constructing the PoP setup 101. It can be seen that the active surface 111 of the transceiver 110 and the molding mass 112 share a surface level as viewed in the Z-direction. Further, the TMVs 114 also communicate entirely through the molding mass 112 in the direction away from the active surface 111 of the transceiver 110.

Figure 1B:
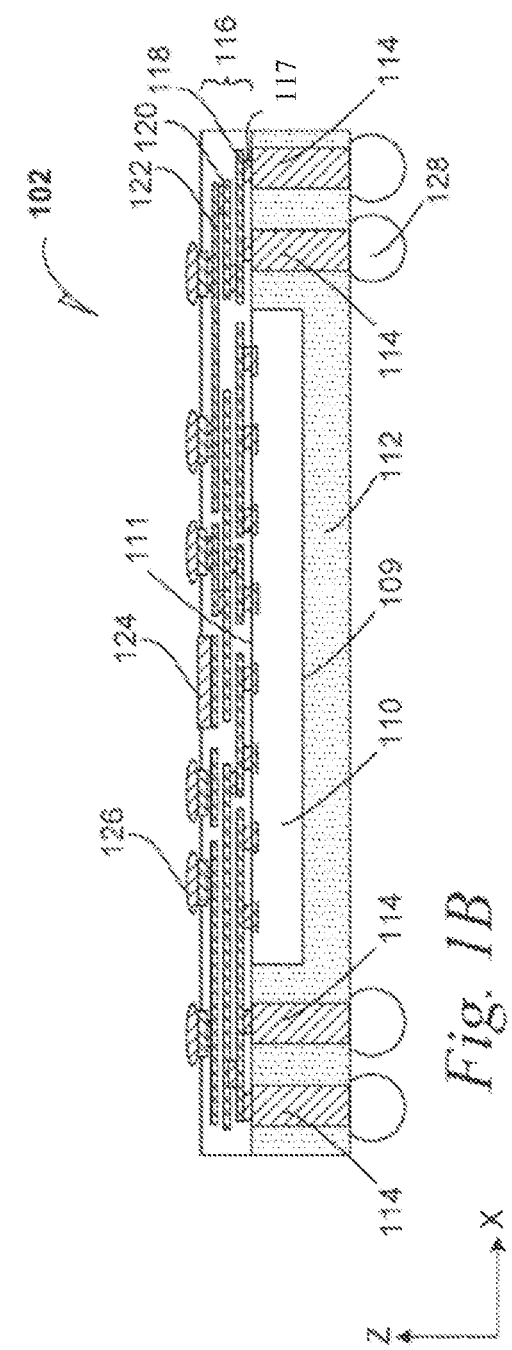
FIG. 1B is a cross-section elevation of the package-on-package setup depicted in FIG. 1A after further processing according to an embodiment.

FIG. 1B is a cross-section elevation of the PoP setup 101 depicted in FIG. 1A after further processing according to an embodiment. The PoP setup 102 includes a redistribution layer (RDL) 116 that has been mated to the active surface 111 as well as to the TMVs 114 at the level of the active surface 11 of the transceiver 110. In an embodiment, the RDL 116 has a thickness in a range from 20 μm to about 60 μm. In an embodiment, the RDL 116 has a thickness of 40 μm.

In an embodiment, the RDL 116 includes at least three traces when viewed along the Z-direction. In an embodiment, the RDL 116 includes a first RLD (RDL1) trace level 118, an RDL2 trace level 120, and an RDL3 trace level 122. The indicated traces 118, 120 and 122 are illustrated to depict the Z-direction level for trace positions within the RDL 116.

In an embodiment, where a three-trace layer RDL 116 is used, a signal pad 124 is coupled to the RDL 116 in order to provide a signal source for a patch antenna. Communication and grounding through the RDL 116 is further made by an emitter-side ball-grid array, one electrical bump of which is indicated with reference number 126. Opposite the emitter-side ball-grid array 126 is a land-side ball-grid array 128.

FIG. 1YZ is a cross-section detail of a portion of the PoP setup 102 depicted in FIG. 1B according to an embodiment. The RDL 116 includes a dielectric material 115 that, although it is depicted simply, the dielectric material 115 may be several dielectric layers that accommodate construction of the several conductive structures.

Among the conductive structures is seen the RDL1 trace level 118, the RDL2 trace level 120 and the RDL3 trace level 122. Additional processing includes a via-2 119 that couples the RDL1 trace level 118 to the RDL2 trace level 120. Similarly, processing includes a via-3 121 that couples the RDL2 trace level 120 to the RDL3 trace level 122. Centered in the structure is a signal portion of the RDL2 trace level 120', which acts as the signal carrier to the signal pad 124 (see FIG. 1B). As illustrated, the signal portion 120' is electrically shielded by the several structures surrounding it.

Additionally, a via-1 117 communicates through the dielectric material 115 as it couples to the RDL1 trace level 118.

FIG. 1C is a cross-section elevation of the PoP setup 102 depicted in FIG. 1B after further processing according to an embodiment. The PoP setup 103 is being wire bonded with a bond wire 130 onto the signal pad 124. Movement of the bond wire 130 is depicted by the dashed directional arrow.

FIG. 1D is a cross-section elevation 104 of the PoP setup 103 depicted in FIG. 1C after further processing according to an embodiment. A patch antenna 132 and ground plane 134 are being stitched to the PoP setup 104 at the wire bond 130, while a ground plane 134 is being bonded to the ball-grid array 126 such as by thermal compression bonding according to an embodiment.

FIG. 1E is a cross-section elevation of the PoP setup 104 depicted in FIG. 1D after further processing according to an embodiment. A patch antenna 132 is stitched to the PoP setup 104 at the bond wire 130. As depicted in FIG. 1D and to achieve a patch antenna and transceiver module 105, the bond wire 130 is soldered 136 to the patch antenna 132 according to an embodiment. The patch antenna and transceiver module 105 may also be referred to as a PoP setup with a patch antenna 105. The bond wire 130 is electrically contacted to the patch antenna 132 while the ground plane 134 is bonded to the ball-grid array 126 according to an embodiment. Additionally, a grounding path 138 completes a return path from the patch antenna 132 to the ground plane 134.

Figure 2:
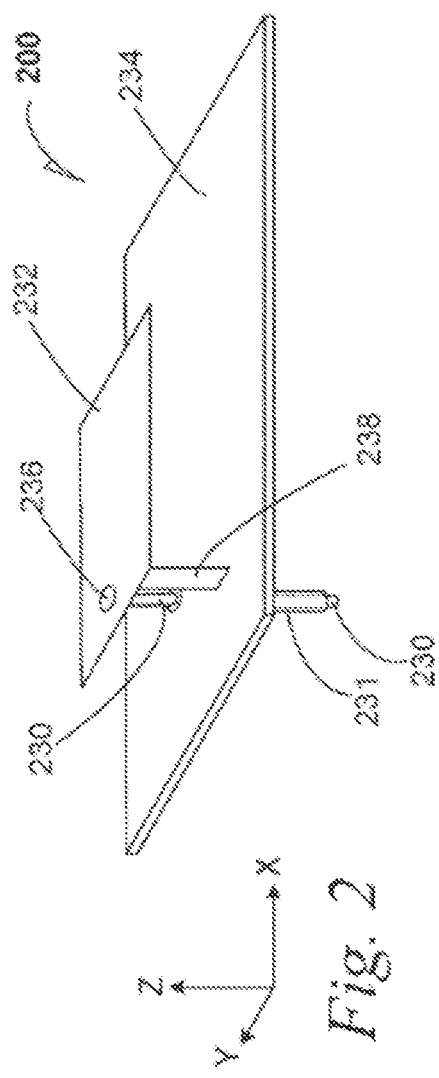
FIG. 2 is a perspective elevation of portions of a patch antenna and ground structure according to an embodiment.

FIG. 2 is a perspective elevation 200 of portions of a patch antenna and ground structure according to an embodiment. A patch antenna 232 is coupled to a coaxial-insulated signal line 230 that pierces a ground plane 234. The signal line 230 carries a coaxial insulation 231, and the signal line 230 contacts the patch antenna 232 such as by a solder weld 236 or a braze weld 236 or the like. Grounding of the patch antenna 232 is accomplished by a grounding tab 238.

Figure 3:
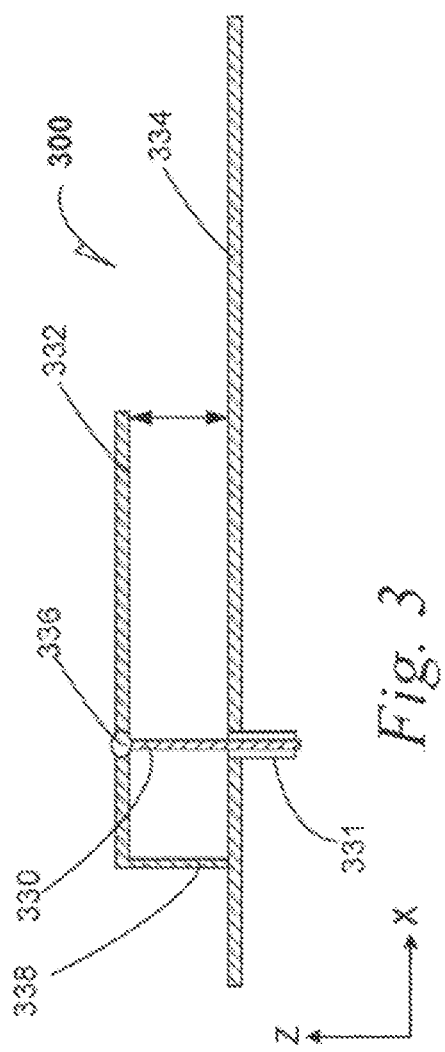
FIG. 3 is a cross-section elevation of portions of a patch antenna and ground structure according to an embodiment.

FIG. 3 is a cross-section elevation 300 of portions of a patch antenna 332 and ground plane 334 according to an embodiment. A patch antenna 332 is coupled to a coaxial-insulated signal line 330 that pierces a ground plane 334. The signal line 330 carries a coaxial insulation 331, and the signal line 330 contacts the patch antenna 332 such as by a solder weld 336 or a braze weld 336 or the like. Grounding of the patch antenna 332 is accomplished by a grounding tab 338. It can be seen that the patch antenna 332 and ground plane 334 are in a planar inverted F-shaped (PIFA) configuration that uses the grounding tab 338.

FIG. 4 is a cross-section elevation 400 of portions of a patch antenna 432 and ground plane 434 that uses an aperture-coupled patch antenna 432 according to an embodiment. The patch antenna 432 is disposed on a substrate 402. The patch antenna 432 is excited through an aperture 440 in the ground plane 434. A signal line 430 emits through the aperture 404 to excite the patch antenna 432. This patch antenna 432 and ground plane 434 structure is also used in an embodiment by assembling it to an RDL. In contrast to PIFA embodiments, the substrate 402 is a non-ambient atmosphere dielectric material.

FIG. 5A is a top plan 501 of a portion of a patch antenna precursor during fabrication according to an embodiment. A lead frame precursor 500 has been fashioned with an opening 540 for connecting a signal line at a portion that will become the patch antenna. In an embodiment, the signal line is a bond wire. Fold lines 505 and 507 indicate where the precursor 500 is to be folded.

Figure 5B:
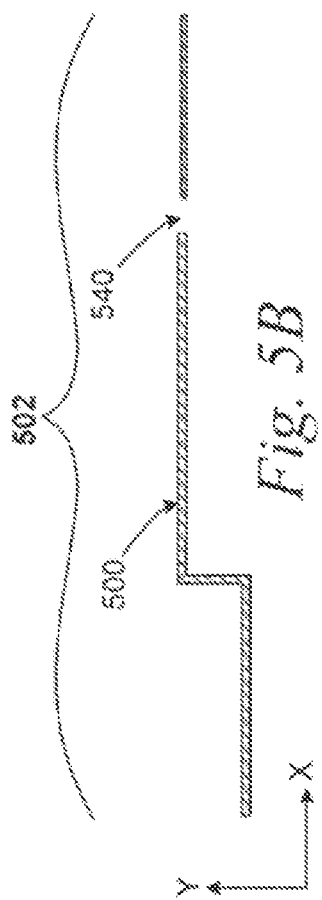
FIG. 5B is a cross-section elevation of the lead frame precursor depicted in FIG. 5A after further processing according to an embodiment.

FIG. 5B is a cross-section elevation 502 of the lead frame precursor 500 depicted in FIG. 5A after further processing according to an embodiment. Folding of the lead frame precursor 500 has begun to fashion a patch antenna and ground plane.

Figure 5C:
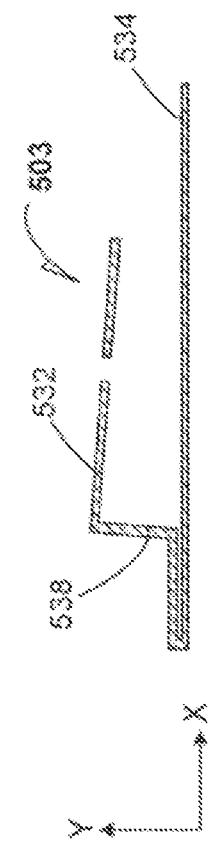
FIG. 5C is a cross-section elevation of the lead frame precursor depicted in FIG. 5B after further processing according to an embodiment.

FIG. 5C is a cross-section elevation 503 of the lead frame precursor depicted in FIG. 5B after further processing according to an embodiment. Further folding of the lead frame precursor is carried out to form the patch antenna portion 532, the ground plane portion 534, and the grounding tab 538.

Figure 5D:
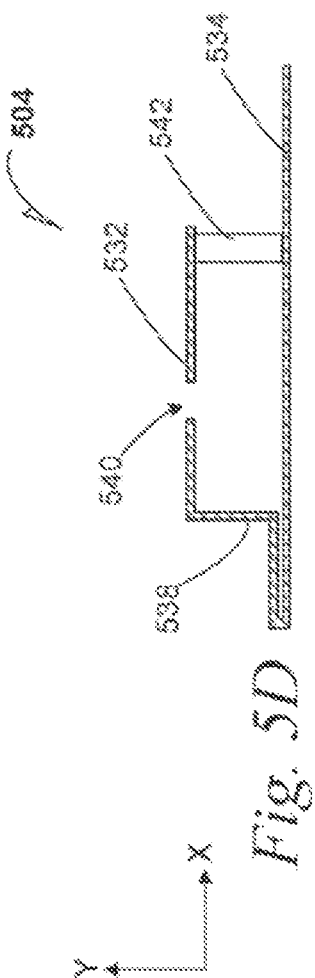
FIG. 5D is a cross-section elevation of portions of the patch antenna and ground structure depicted in FIG. 4C after further processing according to an embodiment.

FIG. 5D is a cross-section elevation 504 of portions of the patch antenna and ground structure depicted in FIG. 5C after further processing according to an embodiment. A patch antenna 532 is grounded by a grounding tab 538 that is part of the folded structure. It can be seen that the patch antenna 532 and the ground plane 534 are an integral structure that has been formed from a lead frame precursor.

Additionally, a spacer 542 props the patch antenna 532 and levels the patch antenna 532 at a useful distance above the ground plane 534. The spacer 542 allows for ambient-gas (usually ambient air) to be the only significant dielectric material between the patch antenna 532 and the ground plane 534. In an embodiment, the Z-direction length of the spacer 542 is in a range from 100 micrometer (μm) to 300 μm. In an embodiment, the length of the spacer 542 is in a range from 100 μm to 200 μm. In an embodiment, the length of the spacer 542 is in a range from 201 μm to 300 μm.

Figure 6:
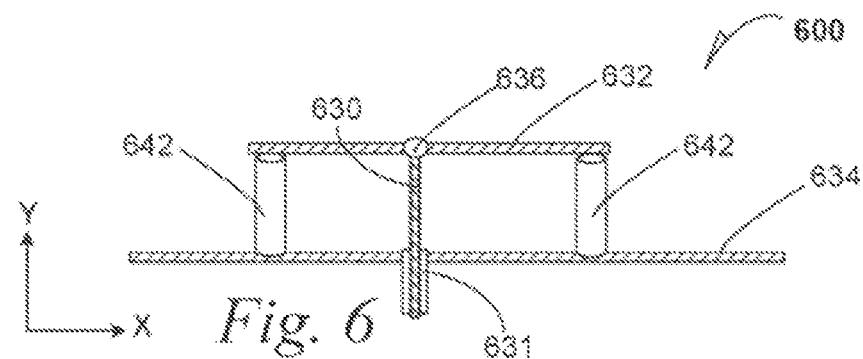
FIG. 6 is a cross-section elevation of portions of a patch antenna plane and a ground plane according to an embodiment.

FIG. 6 is a cross-section elevation 600 of portions of a patch antenna plane 632 and a ground plane 634 according to an embodiment. Similar to other embodiments, a signal line 630 may pierce the ground plane 634 and attach to the patch antenna 632 by a solder weld 636. The patch antenna 632 is disposed on spacers 642. The spacers 642 prop the patch antenna 632 and levels the patch antenna 632 at a useful distance above the ground plane 634. In an embodiment, the spacers 642 have a height in a range from 100 μm to 300 μm. Other height embodiments may be use as set forth in this disclosure.

Figure 7:
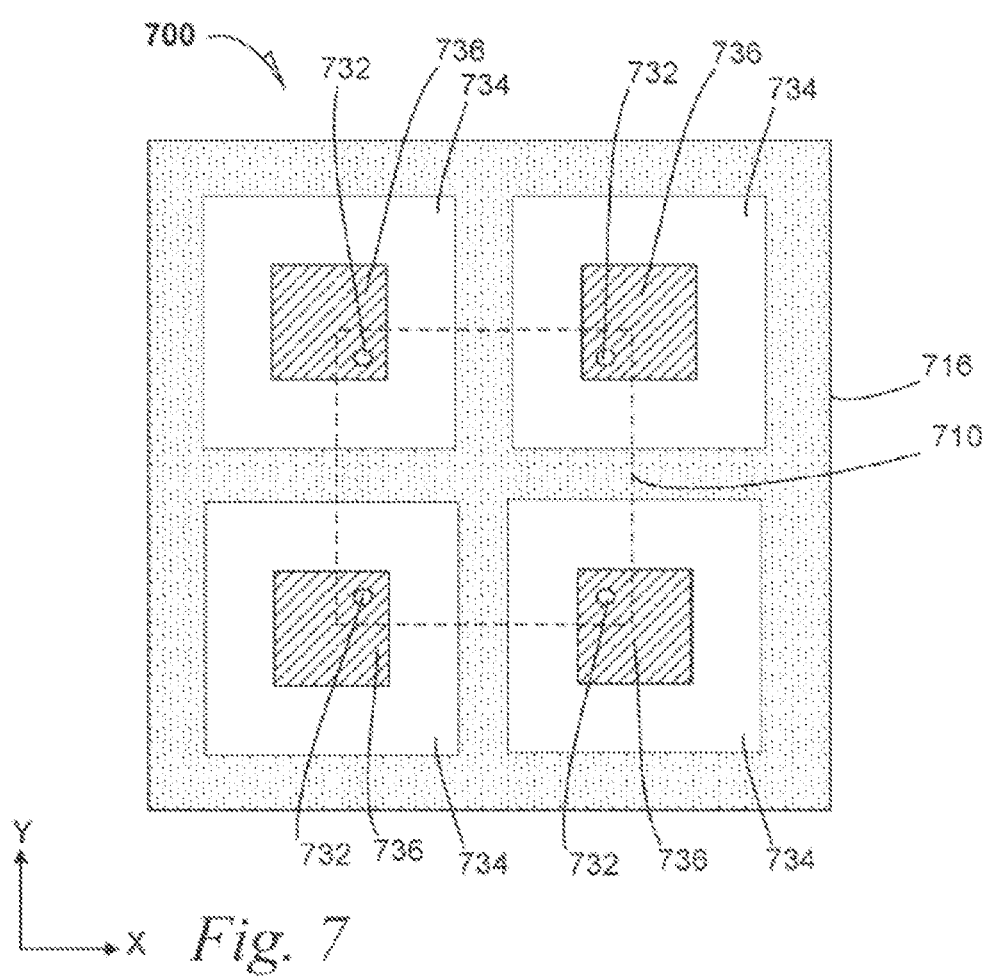
FIG. 7 is a top plan of an antenna-patch array that is stitched to a transceiver according to an embodiment.

FIG. 7 is a top plan of a patch-antenna array 700 that is stitched to a transceiver 710 (depicted in ghosted lines) according to an embodiment. The patch-antenna array 700 includes four occurrences of the patch antenna 736. Each patch antenna 736 is grounded to a ground plane 734. A signal line is illustrated where it has been welded or otherwise attached to the patch antenna at a weld spot 732. The patch-antenna array 700 includes an RDL, the top of which is illustrated at item 716. As depicted, each patch antenna portion 736 is configured with three other patch antenna portions 736 in a rectangular arrangement.

In an embodiment, the transceiver 710 has X-Y dimensions of about 5.6 mm by 5.6 mm. In an embodiment, each patch antenna 736 has X-Y dimensions of about 2 mm by 2 mm. It can be seen that the footprint of the transceiver 710 is intersected by the footprints of each patch antenna 732 according to an embodiment.

FIG. 8 is a cross-section elevation of a patch antenna and transceiver module 800 with folded patch antennas 832 according to an embodiment. The patch antenna and transceiver module 800 may also be referred to as a PoP setup with a patch antenna 800. A folded patch antenna 832 is seated on an RDL 816 according to an embodiment. A bond wire 830 is electrically contacted to the folded patch antenna 832 while the ground plane 834 is coupled to grounding traces within the RDL 816 according to an embodiment.

A plurality of TMVs 814 communicate through a molding mass 812. The active surface 811 of a transceiver 810 emerges from the molding mass 812 at the same Z-direction location as the TMVs 814, within the assembly parameters of constructing the package-on-package setup. Further, the TMVs 814 also communicate entirely through the molding mass 812 in the direction away from the active surface 811 of the transceiver 810. Additionally, the transceiver 832 includes a backside surface 809 that is embedded and blinded off by the molding mass 812.

In an embodiment, a land-side ball-grid array 828 is coupled to the through-mold via 814, and the land-side ball-grid array 828 couples to a board 870. In an embodiment, the board 870 is a motherboard that connects the patch antennas 832 and the transceiver 810 to other devices such as a logic processor. In an embodiment, the board 870 is a motherboard that connects the patch antennas 832 and the transceiver 810 to other devices such as a logic processor, and the board 870 includes an external shell 872 that is useful for the exterior of a computing system such as laptop computer. In an embodiment, the board 870 is a motherboard that connects the patch antennas 832 and the transceiver 810 to other devices such as a logic processor, and the board 870 includes an external shell 872 that is useful for the exterior of a computing system such as hand-held device. It may now be understood that a board such as the board 870 may be applied to any patch antenna and transceiver module embodiment in this disclosure.

FIG. 9 is a cross-section elevation of a portion of a patch antenna and transceiver module 900 according to an embodiment. In some embodiments, a top structure is located vertically (Z-direction) higher than the patch antenna 932. Consequently, it is useful to place spacer structures that allow for the patch antenna 932 to be unencumbered, such as by locating copper-core balls 944 adjacent the patch antenna 932. As illustrated, the copper-core balls 944 create a Z-direction offset to keep an upper structure such as a printed wiring board from encumbering the patch antenna 932.

Figure 10:
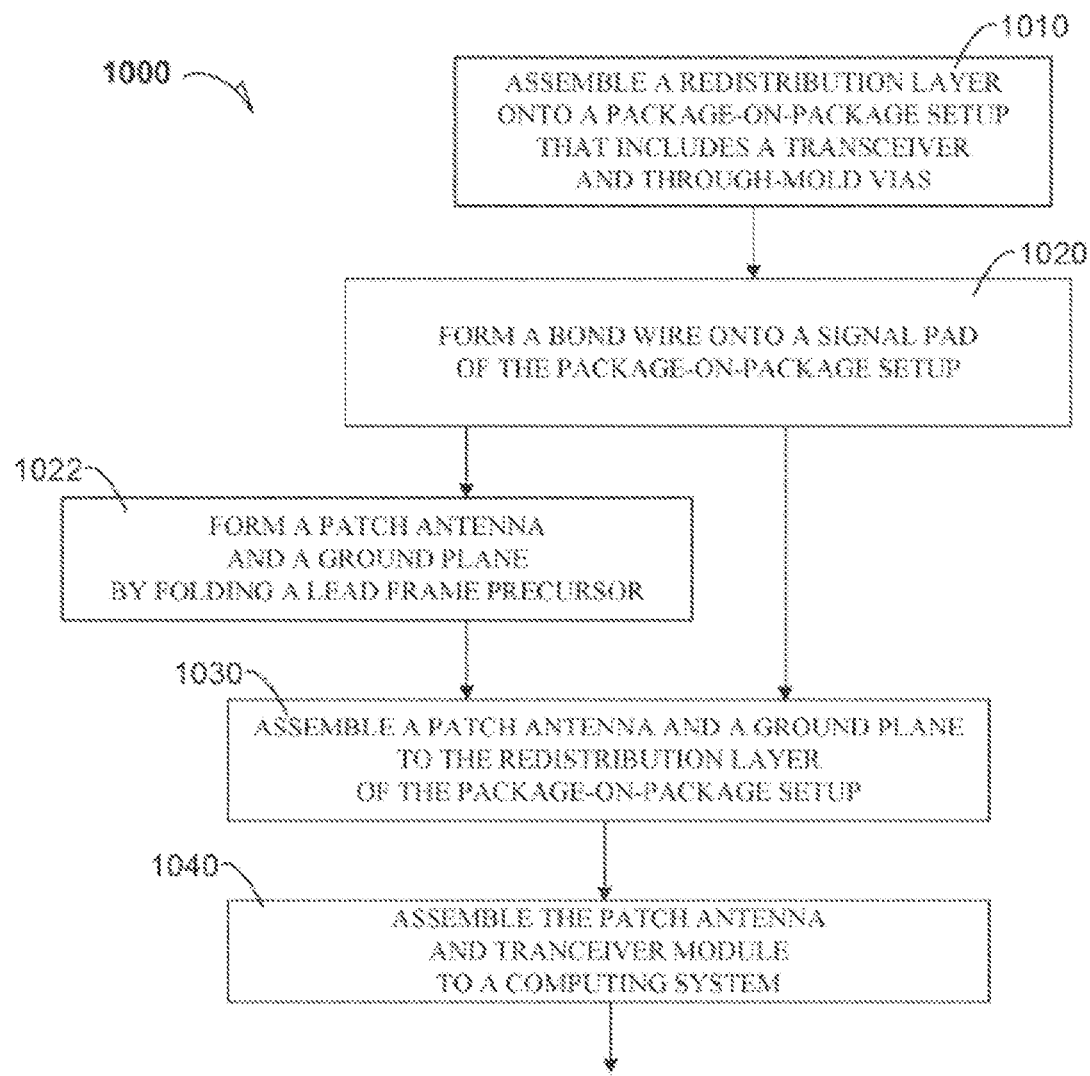
FIG. 10 is a process flow diagram that illustrates assembly of a patch antenna and transceiver module apparatus according to an embodiment.

FIG. 10 is a process flow diagram 1000 that illustrates assembly of a patch antenna and transceiver module apparatus according to an embodiment. At 1010, the process includes assembling a redistribution layer onto a PoP setup that includes a transceiver and TMVs. In a non-limiting example embodiment, the PoP setup 101 depicted in FIG. 1A is assembled to an RDL 116 as depicted in FIG. 1B, to achieve the PoP setup 102.

At 1020, the process includes forming a bond wire onto a signal pad of the PoP setup. In a non-limiting example embodiment, the bond wire 130 depicted in FIG. 1C is bonded onto the signal pad 124 to achieve the PoP setup 104 as depicted in FIG. 1D.

At 1022, the process may include forming a patch antenna and ground plane by folding a lead-frame precursor. In a non-limiting example embodiment, the lead-frame precursor depicted in FIGS. 5A through 5D is hole-stamped 540, folded, and spacer-spread 542 to achieve the patch antenna 532 and ground plane 534 structure depicted in FIG. 5D.

At 1030, the process includes assembling a patch antenna and ground plane to the redistribution layer of the PoP setup. In a non-limiting example embodiment, the patch antenna and transceiver module 800 depicted in FIG. 8 is assembled. In a non-limiting example embodiment, the patch antenna and transceiver module 105 depicted in FIG. 1E is assembled. In a non-limiting example embodiment, a patch antenna and transceiver module is assembled using the patch antenna 632 and ground plane 634 depicted in FIG. 6.

At 1040, the process includes assembling the patch antenna and transceiver module to a computing system. These embodiments are further discussed with respect to FIG. 11.

Figure 11:
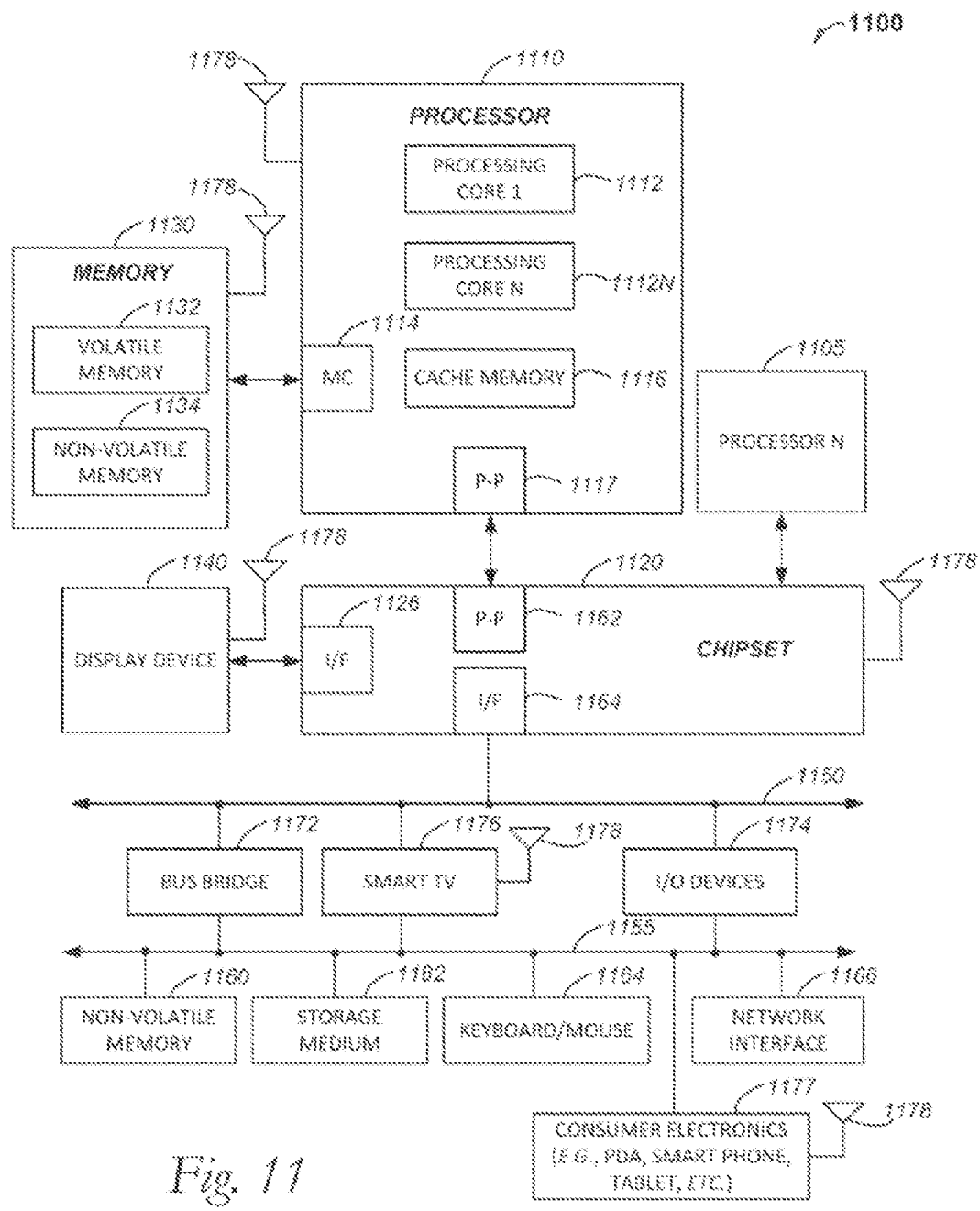
FIG. 11 illustrates examples of a higher level device application for the disclosed embodiments.

FIG. 11 illustrates examples of a higher level device application for the disclosed embodiments. The patch antenna and transceiver module embodiments may be found in several parts of a computing system. In an embodiment, a computing system 1100 includes, but is not limited to, a desktop computer. In an embodiment, a system 1100 includes, but is not limited to a laptop computer. In an embodiment, a system 1100 includes, but is not limited to a netbook. In an embodiment, a system 1100 includes, but is not limited to a tablet. In an embodiment, a system 1100 includes, but is not limited to a notebook computer. In an embodiment, a system 1100 includes, but is not limited to a personal digital assistant (PDA). In an embodiment, a system 1100 includes, but is not limited to a server. In an embodiment, a system 1100 includes, but is not limited to a workstation. In an embodiment, a system 1100 includes, but is not limited to a cellular telephone. In an embodiment, a system 1100 includes, but is not limited to a mobile computing device. In an embodiment, a system 1100 includes, but is not limited to a smart phone. In an embodiment, a system 1100 includes, but is not limited to an internet appliance. Other types of computing device may be configured with the microelectronic device that includes a patch antenna and transceiver module embodiment.

In an embodiment, the processor 1110 has one or more processing cores 1112 and 1112N, where 1112N represents the Nth processor core inside processor 1110 where N is a positive integer. In an embodiment, the electronic device system 1100 using a patch antenna and transceiver module embodiment that includes multiple processors including 1110 and 1105, where the processor 1105 has logic similar or identical to the logic of the processor 1110. In an embodiment, the processing core 1112 includes, but is not limited to, pre-fetch logic to fetch instructions, decode logic to decode the instructions, execution logic to execute instructions and the like. In an embodiment, the processor 1110 has a cache memory 1116 to cache at least one of instructions and data for the patch antenna and transceiver module apparatus in the system 1100. The cache memory 1116 may be organized into a hierarchal structure including one or more levels of cache memory.

In an embodiment, the processor 1110 includes a memory controller 1114, which is operable to perform functions that enable the processor 1110 to access and communicate with memory 1130 that includes at least one of a volatile memory 1132 and a non-volatile memory 1134. In an embodiment, the processor 1110 is coupled with memory 1130 and chipset 1120. The processor 1110 may also be coupled to a wireless antenna 1178 to communicate with any device configured to at least one of transmit and receive wireless signals. In an embodiment, the wireless antenna interface 1178 operates in accordance with, but is not limited to, the IEEE 802.11 standard and its related family, Home Plug AV (HPAV), Ultra Wide Band (UWB), Bluetooth, WiMax, or any form of wireless communication protocol. In an embodiment, antenna configurations include a patch antenna and transceiver module apparatus.

In an embodiment, the volatile memory 1132 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. The non-volatile memory 1134 includes, but is not limited to, flash memory, phase change memory (PCM), read-only memory (ROM), electrically erasable programmable read-only memory (EEPROM), or any other type of non-volatile memory device.

The memory 1130 stores information and instructions to be executed by the processor 1110. In an embodiment, the memory 1130 may also store temporary variables or other intermediate information while the processor 1110 is executing instructions. In the illustrated embodiment, the chipset 1120 connects with processor 1110 via Point-to-Point (PtP or P-P) interfaces 1117 and 1122. Either of these PtP embodiments may be achieved using a patch antenna and transceiver module apparatus embodiment as set forth in this disclosure. The chipset 1120 enables the processor 1110 to connect to other elements in the patch antenna and transceiver module apparatus in a system 1100. In an embodiment, interfaces 1117 and 1122 operate in accordance with a PtP communication protocol such as the Intel® QuickPath Interconnect (QPI) or the like. In other embodiments, a different interconnect may be used.

In an embodiment, the chipset 1120 is operable to communicate with the processor 1110, 1105N, the display device 1140, and other devices 1172, 1176, 1174, 1160, 1162, 1164, 1166, 1177, etc. The chipset 1120 may also be coupled to a wireless antenna 1178 to communicate with any device configured to at least do one of transmit and receive wireless signals.

The chipset 1120 connects to the display device 1140 via the interface 1126. The display 1140 may be, for example, a liquid crystal display (LCD), a plasma display, cathode ray tube (CRT) display, or any other form of visual display device. In an embodiment, the processor 1110 and the chipset 1120 are merged into a patch antenna and transceiver module apparatus in a system. Additionally, the chipset 1120 connects to one or more buses 1150 and 1155 that interconnect various elements 1174, 1160, 1162, 1164, and 1166. Buses 1150 and 1155 may be interconnected together via a bus bridge 1172 such as at least one patch antenna and transceiver module apparatus embodiment. In an embodiment, the chipset 1120 couples with a non-volatile memory 1160, a mass storage device(s) 1162, a keyboard/mouse 1164, and a network interface 1166 by way of at least one of the interface 1124 and 1174, the smart TV 1176, and the consumer electronics 1177, etc.

In an embodiment, the mass storage device 1162 includes, but is not limited to, a solid state drive, a hard disk drive, a universal serial bus flash memory drive, or any other form of computer data storage medium. In one embodiment, network interface 1166 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 11 are depicted as separate blocks within the patch antenna and transceiver module apparatus embodiment in a computing system 1100, the functions performed by some of these blocks may be integrated within a single semiconductor circuit or may be implemented using two or more separate integrated circuits. For example, although cache memory 1116 is depicted as a separate block within processor 1110, cache memory 1116 (or selected aspects of 1116) can be incorporated into the processor core 1112. Where useful, the computing system 1100 may have an outer shell such as the outer shell 164 depicted in FIG. 2. In an embodiment, an outer shell is an electrically insulated structure that also provides physical protection for the patch antenna and transceiver module apparatus embodiment.

To illustrate the patch antenna and transceiver module apparatus embodiments and methods disclosed herein, a non-limiting list of examples is provided herein:

Example 1 is a patch antenna and transceiver module, comprising: a transceiver disposed in a molding mass, the transceiver including an active surface and a backside surface, wherein the active surface and the molding mass share a surface level; a through-mold via that communicates through the molding mass including one end thereof emerging at the active surface level and the other end thereof emerging at a land side of the molding mass; a redistribution layer (RDL) disposed on the active surface of the transceiver and the through-mold via, wherein the RDL couples one of signal and ground traces to the active surface and through-mold via; a signal pad disposed in the RDL; a bond wire contacting the signal pad; and a patch antenna and ground plane assembly, wherein the bond wire contacts the patch antenna, and wherein the ground plane is coupled to a ground trace.

In Example 2, the subject matter of Example 1 optionally includes wherein the ground plane is grounded through the RDL by a ball-grid array disposed on the RDL.

In Example 3, the subject matter of any one or more of Examples 1-2 optionally include wherein the ground plane is grounded through the RDL by a ball-grid array disposed on the RDL, and wherein the ball-grid array includes some copper-core balls that create a standoff height that is higher than the patch antenna.

In Example 4, the subject matter of any one or more of Examples 1-3 optionally include wherein the patch antenna and the ground plane are an integral structure.

In Example 5, the subject matter of any one or more of Examples 1-4 optionally include wherein the patch antenna and the ground plane are an integral structure, and wherein the patch antenna and the ground plane are set apart by a spacer.

In Example 6, the subject matter of any one or more of Examples 1-5 optionally include wherein the patch antenna and the ground plane are set apart by a spacer.

In Example 7, the subject matter of any one or more of Examples 1-6 optionally include wherein the patch antenna and the ground plane are set apart by a spacer, wherein the spacer is one of a plurality of spacers.

In Example 8, the subject matter of any one or more of Examples 1-7 optionally include the RDL has a thickness in a range from 20 micrometer to 60 micrometer.

In Example 9, the subject matter of any one or more of Examples 1-8 optionally include the RDL has a thickness in a range from 20 micrometer to 60 micrometer, and the patch antenna and the ground plane are spaced apart in a range from 100 micrometer to 300 micrometer.

In Example 10, the subject matter of any one or more of Examples 1-9 optionally include wherein the transceiver occupies a transceiver footprint in the module, and wherein the patch antenna occupies a patch antenna footprint, and wherein the patch antenna footprint intersects the transceiver footprint.

In Example 11, the subject matter of any one or more of Examples 1-10 optionally include wherein the transceiver occupies a transceiver footprint in the module, and wherein the patch antenna is one of four patch antennas and each of the four patch antennas occupies a patch antenna footprint, and wherein each patch antenna footprint intersects the transceiver footprint.

In Example 12, the subject matter of any one or more of Examples 1-11 optionally include wherein the transceiver occupies a transceiver footprint in the module, and wherein the patch antenna is one of four patch antennas and each of the four patch antennas occupies a patch antenna footprint, wherein each patch antenna footprint intersects the transceiver footprint, and wherein each patch antenna and corresponding ground plane are an integral structure.

In Example 13, the subject matter of any one or more of Examples 1-12 optionally include a land side ball grid array coupled to the through-mold via; and a board coupled to the land side ball grid array.

Example 14 is a method of stitching a patch antenna onto a package-on-package setup, comprising: assembling a redistribution layer onto a package-on-package setup that includes a transceiver; forming a bond wire onto a signal pad of the PoP setup; assembling a patch antenna and ground plane to the redistribution layer, wherein the bond wire contacts the patch antenna; and coupling the ground plane to a through-mold via in the PoP setup.

In Example 15, the subject matter of Example 14 optionally includes wherein patch antenna is one of four patch antennas, and wherein each patch antenna is configured with the other three in a rectangular arrangement.

In Example 16, the subject matter of any one or more of Examples 14-15 optionally include folding a lead frame precursor to form a patch-antenna portion, a ground-plane portion, and a grounding-tab portion, wherein the patch-antenna portion includes an opening for connecting a signal line; and propping the patch-antenna portion with a spacer.

In Example 17, the subject matter of Example 16 optionally includes wherein the lead frame precursor is one of four lead frame precursors, and wherein each patch antenna is integral to a corresponding ground plane and each patch antenna is assembled with the three more patch antennas in a rectangular arrangement.

Example 18 is a computing system, comprising: a logic processor, a patch antenna and transceiver module coupled to the logic processor, the module including: a transceiver disposed in a molding mass, the transceiver including an active surface and a backside surface, wherein the active surface and the molding mass share a surface level; a through-mold via that communicates through the molding mass including one end thereof emerging at the active surface level and the other end thereof emerging at a land side of the molding mass; a redistribution layer (RDL) disposed on the active surface of the transceiver and the through-mold via, wherein the RDL couples signal and ground traces to the active surface and through-mold via; a signal pad disposed in the RDL; a bond wire contacting the signal pad; and a patch antenna and ground plane assembly, wherein the bond wire contacts the patch antenna, and wherein the ground plane is coupled to a ground trace.

In Example 19, the subject matter of Example 18 including the patch antenna and ground plane are an integral folded structure and optionally includes a land side ball grid array coupled to the through-mold via; a board coupled to the land side ball grid array, and wherein the board is a motherboard and a motherboard with an external shell.

In Example 20, the subject matter of any one or more of Examples 18-19 optionally include a land side ball grid array coupled to the through-mold via; a board coupled to the land side ball grid array, and wherein the board includes a motherboard with an external shell.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electrical device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A patch antenna and transceiver module, comprising:
a transceiver disposed in a molding mass, the transceiver including an active surface and a backside surface, wherein the active surface and the molding mass share a surface level;
a through-mold via that communicates through the molding mass including one end thereof emerging at the active surface level and the other end thereof emerging at a land side of the molding mass;
a redistribution layer (RDL) disposed on the active surface of the transceiver and the through-mold via, wherein the RDL couples one of signal and ground traces to the active surface and through-mold via;
a signal pad disposed in the RDL;
a bond wire contacting the signal pad; and
a patch antenna and ground plane assembly, wherein the bond wire contacts the patch antenna, and wherein the ground plane is coupled to a ground trace, and wherein the patch antenna and the ground plane are an integral structure including at least one fold.

2. The patch antenna and transceiver module of claim 1, wherein the ground plane is grounded through the RDL by a ball-grid array disposed on the RDL.

3. The patch antenna and transceiver module of claim 1, wherein the ground plane is grounded through the RDL by a ball-grid array disposed on the RDL, and wherein the ball-grid array includes some copper-core balls that create a standoff height that is higher than the patch antenna.

4. The patch antenna and transceiver module of claim 1, wherein the patch antenna and the ground plane are an integral structure, and wherein the patch antenna and the ground plane are set apart by a spacer.

5. The patch antenna and transceiver module of claim 1, wherein the patch antenna and the ground plane are set apart by a spacer.

6. The patch antenna and transceiver module of claim 1, wherein the patch antenna and the ground plane are set apart by a spacer, wherein the spacer is one of a plurality of spacers.

7. The patch antenna and transceiver module of claim 1, wherein the RDL has a thickness in a range from 20 micrometer to 60 micrometer.

8. The patch antenna and transceiver module of claim 1, wherein the RDL has a thickness in a range from 20 micrometer to 60 micrometer, and wherein the patch antenna and the ground plane are spaced apart in a range from 100 micrometer to 300 micrometer.

9. The patch antenna and transceiver module of claim 1, wherein the transceiver occupies a transceiver footprint in the module, and wherein the patch antenna occupies a patch antenna footprint, and wherein the patch antenna footprint intersects the transceiver footprint.

10. The patch antenna and transceiver module of claim 1, wherein the transceiver occupies a transceiver footprint in the module, and wherein the patch antenna is one of four patch antennas and each of the four patch antennas occupies a patch antenna footprint, and wherein each patch antenna footprint intersects the transceiver footprint.

11. The patch antenna and transceiver module of claim 1, wherein the transceiver occupies a transceiver footprint in the module, and wherein the patch antenna is one of four patch antennas and each of the four patch antennas occupies a patch antenna footprint, wherein each patch antenna footprint intersects the transceiver footprint, and wherein each patch antenna and corresponding ground plane are an integral structure.

12. The patch antenna and transceiver module of claim 1, further including:
a land side ball grid array coupled to the through-mold via; and
a board coupled to the land side ball grid array.

13. A computing system, comprising:
a logic processor,
a patch antenna and transceiver module coupled to the logic processor, the module including:
a transceiver disposed in a molding mass, the transceiver including an active surface and a backside surface, wherein the active surface and the molding mass share a surface level;
a through-mold via that communicates through the molding mass including one end thereof emerging at the active surface level and the other end thereof emerging at a land side of the molding mass;
a redistribution layer (RDL) disposed on the active surface of the transceiver and the through-mold via, wherein the RDL couples signal and ground traces to the active surface and through-mold via;
a signal pad disposed in the RDL;
a bond wire contacting the signal pad; and
a patch antenna and ground plane assembly, wherein the bond wire contacts the patch antenna, and wherein the ground plane is coupled to a ground trace, and wherein the patch antenna and the ground plane are an integral structure including at least one fold.

14. The computing system of claim 13, wherein the patch antenna and ground plane are an integral folded structure, further including:
a land side ball grid array coupled to the through-mold via;
a board coupled to the land side ball grid array, and wherein the board is a motherboard and a motherboard with an external shell.

15. The computing system of claim 13, further including:
a land side ball grid array coupled to the through-mold via;
a board coupled to the land side ball grid array, and wherein the board includes a motherboard with an external shell.

\* \* \* \* \*